(12) United States Patent
Kim et al.

(10) Patent No.: US 11,500,244 B2
(45) Date of Patent: Nov. 15, 2022

(54) BACKLIGHT UNIT USING MINI LED OR MICRO LED AS LIGHT SOURCE

(71) Applicant: LMS Co., Ltd., Pyeongtaek-si (KR)

(72) Inventors: Jin Hwan Kim, Pyeongtaek-si (KR); Hyuck Yi Kwon, Pyeongtaek-si (KR); Young Man Kim, Pyeongtaek-si (KR)

(73) Assignee: LMS CO., LTD., Pyeongtaek-si (KR)

( * ) Notice: Subject to any disclaimer, the term of this patent is extended or adjusted under 35 U.S.C. 154(b) by 0 days.

(21) Appl. No.: 17/475,151

(22) Filed: Sep. 14, 2021

(65) Prior Publication Data

US 2021/0405449 A1  Dec. 30, 2021

Related U.S. Application Data

(63) Continuation of application No. PCT/KR2020/003136, filed on Mar. 6, 2020.

(30) Foreign Application Priority Data

Mar. 14, 2019  (KR) .......................... 10-2019-0029287

(51) Int. Cl.
*G02F 1/13357* (2006.01)
*G02B 5/02* (2006.01)
(Continued)

(52) U.S. Cl.
CPC ..... *G02F 1/133603* (2013.01); *G02B 5/0231* (2013.01); *G02B 5/045* (2013.01); *G02F 1/133606* (2013.01); *H01L 33/507* (2013.01)

(58) Field of Classification Search
CPC ......... G02F 1/133603; G02F 1/133606; G02F 2202/36; G02F 1/133605; G02F 1/133607;
(Continued)

(56) References Cited

U.S. PATENT DOCUMENTS 8,333,496 B2 * 12/2012  Han ..................... G02B 6/0051
                                                        362/610
2004/0080938 A1 * 4/2004  Holman ................. F21S 41/12
                                                        362/245
(Continued)

FOREIGN PATENT DOCUMENTS

KR  10-2005-0053610 A   6/2005
KR  10-2011-0077624 A   7/2011
(Continued)

OTHER PUBLICATIONS

Jo et al., KR1020170079416, Jul. 2017, machine translation (Year: 2017).*

(Continued)

*Primary Examiner* — Tracie Y Green
(74) *Attorney, Agent, or Firm* — Polsinelli PC

(57) ABSTRACT

Disclosed is a backlight unit using a mini light-emitting diode (LED) or a micro LED as a light source according to various embodiments of the present invention. The backlight unit may comprise: a color conversion sheet for converting the color of light emitted from the mini LED or the micro LED; a first diffusion lens sheet disposed on one side of the color conversion sheet and having a plurality of first lenses having a triangular pyramid shape formed to be arranged in a first direction on one surface thereof; and a second diffusion lens sheet disposed on one side of the first diffusion lens sheet, and having a plurality of second lenses having a triangular pyramid shape formed to be arranged in a second direction on one surface thereof.

9 Claims, 15 Drawing Sheets

(51) Int. Cl.
*G02B 5/04* (2006.01)
*H01L 33/50* (2010.01)

(58) Field of Classification Search
CPC ......... G02F 1/133611; G02F 1/133614; G02F 1/133617; G02B 5/0231; G02B 5/045; G02B 5/02; G02B 6/0051; G02B 6/0053; H01L 33/507; H01L 25/0753; H01L 33/504; H01L 33/58
See application file for complete search history.

(56) References Cited

U.S. PATENT DOCUMENTS

2005/0212989 A1    9/2005  Kashiwagi et al.
2016/0298828 A1*  10/2016  Chang ............... G02F 1/133605
2019/0346594 A1*  11/2019  Zhang ................. G02B 5/0226
2022/0057547 A1*   2/2022  Kim ........................ F21V 5/004

FOREIGN PATENT DOCUMENTS

KR    10-2017-0079416 A    7/2017
KR    10-2017-0127983 A   11/2017
KR    10-2018-0007454 A    1/2018

OTHER PUBLICATIONS

Kim, KR1020110077624, Jul. 2011, machine translation (Year: 2011).*
Translstion of International Search Report (ISR) (Year: 2020).*
International Search Report dated Jun. 19, 2020 issued in PCT Patent Application No. PCT/KR2020/003136 w/English Translation (4 pages).

* cited by examiner

| Sheet combination | QD/BW/Y (ref.) 201 | QD/PY(0D)/Y 202 | CC/PY(0D)/PY(40D)/Y 203 | QD/PY(120'0D)/R/PY(0D)/R/Y 204 |
|---|---|---|---|---|
| Thickness (um) | 325 | 268 | 318 | 314 |
| Luminance (9P average) | 100% | 94% | 86% | 97% |
| HSV* (%) | 5.9 | 5.3 | 3.6 | 5.1 |
| Luminance uniformity (%) | 77 | 78 | 79 | 83 |
| x | 0.2174 | 0.2227 | 0.2287 | 0.2195 |
| y | 0.191 | 0.202 | 0.2138 | 0.1946 |
| Hot Spot |  |  |  |  |
| Degree of spreading the light |  |  |  |  |
| Structure |  |  |  |  |

| Sheet combination | CC/D3/X (Ref.) | CC/PY(90)2/Y | CC/PY(120)R/PY(90)R/X | CC/PY(120)R/PY(90)R/Y | CC/PY(120)R2/X |
|---|---|---|---|---|---|
| | 211 | 212 | 213 | 214 | 215 |
| Thickness (μm) | 385 | 316 | 314 | 314 | 277 |
| Luminance (9P average) | 100% | 109% | 136% | 127% | 129% |
| HSV* (%) | 5.2 | 4.1 | 5.5 | 5.1 | 5.7 |
| Luminance uniformity (%) | 83 | 84 | 83 | 83 | 84 |
| x | 0.2329 | 0.2276 | 0.2151 | 0.2195 | 0.2141 |
| y | 0.2182 | 0.211 | 0.1864 | 0.1946 | 0.1845 |
| Hot Spot | | | | | |
| Structure | XLAS / DLAS / DLAS / QD / ML | YLAS / PY(90) / PY(90) / QD / ML | XLAS / PY(90)R / PY(120)R / QD / ML | YLAS / PY(90)R / PY(120)R / QD / ML | XLAS / PY(120)R / PY(120)R / QD / ML |

FIG.21

BACKLIGHT UNIT USING MINI LED OR MICRO LED AS LIGHT SOURCE

CROSS-REFERENCE TO RELATED APPLICATION

This application is continuation of International Application No. PCT/KR2020/003136 filed on Mar. 6, 2020, which claims priority to Korean Application No. 10-2019-0029287 filed on Mar. 14, 2019, which applications are incorporated herein by reference.

BACKGROUND

Field of the Disclosure

The present invention relates to a backlight unit using a mini-LED or a micro-LED as a light source, and more particularly, to a backlight unit that easily facilitates separation and diffusion of transmitted mini-LED or micro-LED light.

Description of the Background

As research on a LED (Light Emitting Diode) has advanced, the light energy conversion efficiency of the LED is increasing, and the LED is rapidly replacing existing light emitting devices.

LEDs currently developed have advantages such as miniaturization, light weight, and low power consumption. Accordingly, the LEDs are being actively used as light sources for various image display devices.

The size of the LED chip is gradually getting smaller. For examples of miniature LED chips, there are mini LEDs and micro LEDs. In general, the chip size of the mini LED may be defined as 100 μm to 200 μm, and the chip size of the micro LED may be defined as 5 μm to 100 μm. For the mini LEDs or the micro LEDs, each LED chip individually becomes a pixel or a light source thereby restrictions on the size and shape of the display are eliminated, and clearer image quality can be realized than when a conventional light source is used.

Along with the miniaturization of LED chip size, research on backlight units to supplement LED light characteristics is also active.

SUMMARY

The present invention provides a backlight unit that minimizes luminance loss of light emitted from a mini-LED or micro-LED and limits the occurrence of hot spots by uniformly spreading the light.

The present invention provides a backlight unit that converts light emitted from a mini LED or micro LED into white light while minimizing loss of luminance of light and uniformly spreading light.

A backlight unit using a mini LED (Light Emitting Diode) or a micro LED as a light source according to various embodiments of the present invention comprises a color conversion sheet which converts a color of light emitted from the mini LED or the micro LED, a first diffusion lens sheet where a plurality of first lenses in the shape of a triangular pyramid aligned in the first direction and placed on one side of the color conversion sheet, and a second diffusion lens sheet disposed on one surface of which a plurality of second lenses having a triangular pyramid shape are aligned in the second direction.

According to various embodiments of the present invention, the backlight unit may minimize the loss of luminance of light emitted from the mini LED or the micro LED, and may limit the occurrence of hot spots by uniformly spreading the light.

According to various embodiments of the present disclosure, the backlight unit may convert light emitted from the mini LED or micro LED into white light while minimizing loss of luminance of light and uniformly spreading the light.

BRIEF DESCRIPTION OF THE DRAWINGS

FIG. 21 shows an optical test result of a backlight unit according to another embodiment of the present invention.

DETAILED DESCRIPTION

Now, the principle of operation of a preferred embodiment of the present invention will be described in detail with reference to the accompanying drawings. In addition, when it is determined that a detailed description of a related well-known function or configuration may obscure the gist of the present disclosure in describing an embodiment of the present invention, the detailed description will be omitted. And the terms used below are for terms defined in consideration of functions in the present invention which may vary depending on the intention or custom of the user or operator. Therefore, the definitions of the terms used should be interpreted based on the contents and corresponding functions throughout this specification.

A backlight unit is a light source of a liquid crystal display (LCD). A liquid crystal display device is an element that does not emit light by itself. Accordingly, the backlight unit including the light source irradiates light toward the liquid crystal panel from the rear surface of the liquid crystal display device. Through this, an identifiable image can be implemented.

In general, the backlight unit uses a cold cathode fluorescent lamp (CCFL), an external electrode fluorescent lamp, and a light emitting diode (referred to as LED) as a light source.

A backlight unit is divided into edge type and direct type according to the arrangement structure of the light source. Because the direct type can be dividedly driven compared to the edge type, it can display images can be more delicately implemented than the edge type.

Figure 1:
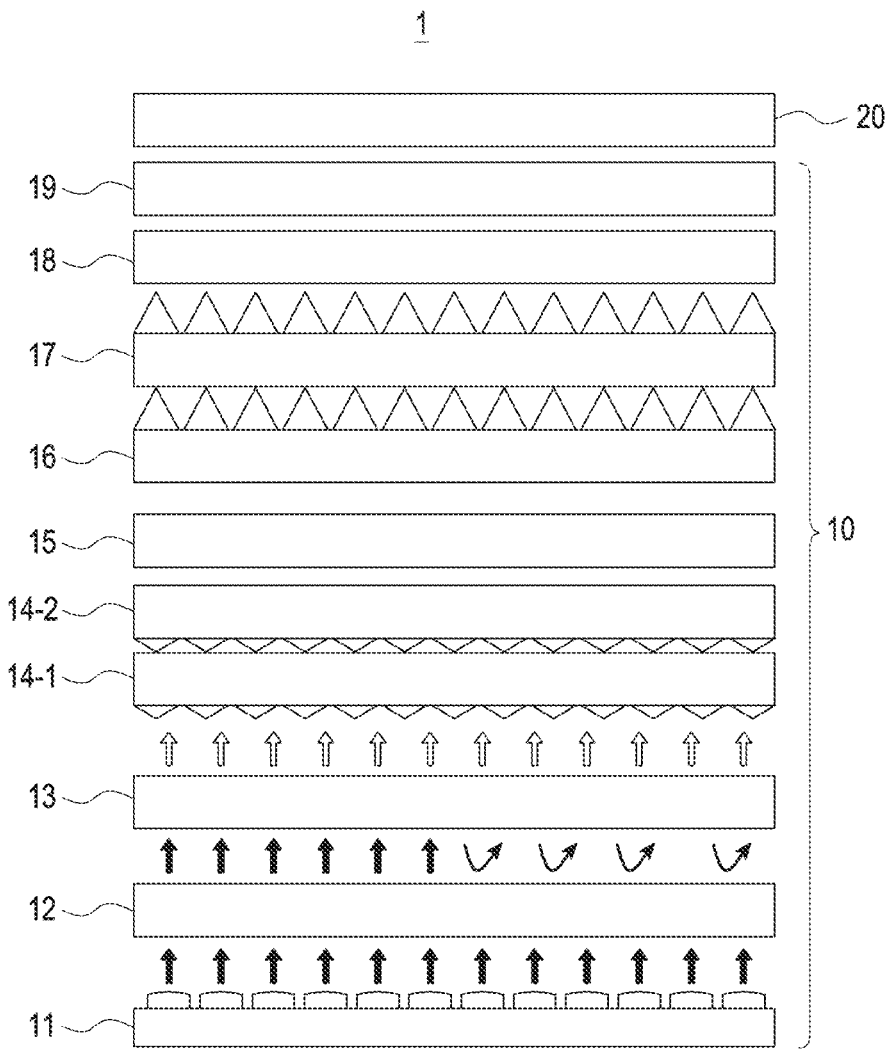
FIG. 1 is an exploded view of a liquid crystal display according to an embodiment of the present invention.

FIG. 1 is an exploded view of a liquid crystal display according to an embodiment of the present invention.

Referring to FIG. 1, a liquid crystal display (LCD) device (1) includes a backlight unit (10) and a liquid crystal panel (20). In general, the backlight unit (10) may be provided at the rear of the liquid crystal panel (20) to irradiate light to the liquid crystal panel (20). The backlight unit (10) may include a light source (11), a reflection sheet (12), a color conversion sheet (13), diffusion lens sheets (14-1, 14-2), diffusion sheets (15, 18), prism sheets (16, 17) and a reflective polarizing sheet (19). Here, the backlight unit (10) may be formed without including at least one of the components (11 to 19) in the backlight unit (10), or with addition of other components other than the components (11 to 19) in the backlight unit (10). In addition, the backlight unit (10) may be formed in various combinations including at least one of the components (11 to 19) in the backlight unit (10).

The light source (11) provides light. For example, the light source (11) may include a plurality of LED chips that emit light. For example, referring to FIG. 2, the LED chips (11'-1) may be arranged in a tiled pattern to form a direct type (11').

The LEDs depend on the size of the LED chip, including large LEDs (chip size: 1,000 μm or more), middle LEDs (chip size: 300-500 μm), small LEDs (chip size: 200-300 μm), mini LEDs (chip size 100-200 μm), and micro LEDs (chip size: 100 μm or less). Here, the LEDs may include a material such as InGaN or GaN.

As the chip size of the LED of the backlight unit decreases, the number of LEDs can be easily adjusted, so that the luminance characteristic and color uniformity of the liquid crystal display (1) can be improved and the LCD can be slim. In addition, as the chip size of the LED becomes smaller, power consumption can be reduced, thereby reducing battery consumption of the portable device and extending the battery life.

In case of using a mini LED or a micro LED compared to the existing a direct type LED, the size of the LED becomes smaller, so local dimming is possible. Local dimming can improve picture quality and save power. Here, the local dimming is a technology for controlling the brightness of an LED used as a backlight based on a configuration or characteristic of a screen, and is a technology capable of remarkably improving a contrast ratio and reducing power consumption. As an example of local dimming, dark colors are expressed by adjusting the brightness of the mini LED or the micro LED corresponding to the dark screen to be relatively dark, and vivid colors can be expressed by relatively brightening the brightness of the mini LED or the micro LED corresponding to the bright screen.

The reflective sheet (12) reflects light. The reflective sheet (12) transmits light in the light direction of the light emitted from the light source (11) and reflects the reflected light caused by the interfacial reflection from the upper portion to the light direction. Through this, loss of light can be minimized. The reflective sheet (12) may perform light recycling.

The color conversion sheet (13) converts the color of the light emitted from the light source (11). For example, the light of the mini LED or the micro LED is blue light (450 nm). In this case, the blue light needs to be converted into white light. The color conversion sheet (13) may convert the blue light into the white light while transmitting blue light. For example, the color conversion sheet (13) may include quantum dots.

The diffusing lens sheets (14-1, 14-2) diffuse light. Each of the diffusion lens sheets (14-1, 14-2) has a plurality of light diffusion lenses disposed on one surface. For example, the light diffusion lens may be formed in a pyramid shape to promote light diffusion. In this case, the diffusion lens sheets (14-1, 14-2) may separate and diffuse the light emitted from the light source (11) (e.g., a mini LED or a micro LED). Here, the diffusion lens sheets (14-1, 14-2) can minimize the amount of light that is reflected in the opposite direction to the incident direction while most of the light incident through the pyramid-shaped light diffusion lens is separated and diffused. Accordingly, visibility of the light source (11) can be minimized while minimizing or improving the luminance loss.

The diffusion sheets (15, 18) can uniformly disperse the incident light. The diffusion sheets (15, 18) can cause light diffusion by light diffusion beads material by applying a solution including at least one of a curable resin (where it can be used alone or mixed from one or more selected from e.g., urethane acrylate, epoxy acrylate, ester acrylate, ester acrylate, and radical generating monomer) to which light diffusion agent beads are added. In addition, in the diffusion sheets (15, 18), a protrusion pattern (or protrusion) having a uniform or non-uniform size shape (e.g., a spherical shape) may be disposed to promote light diffusion.

The prism sheets (16, 17) may condense the incident light using an optical pattern formed on the surface and emit it to the liquid crystal panel (20). The prism sheets (16, 17) may be formed of an optical pattern layer in which an optical pattern in the form of a triangular array having a generally inclined surface of 45° is formed on an upper portion of the translucent base film to improve luminance in the front direction.

The reflective polarizing sheet (19) is provided on the prism sheets (16, 17) to transmit one polarized light with respect to the light collected from the prism sheets (16, 17) and reflect the other polarized light downward to recycle the light.

The liquid crystal panel 20 modulates the light irradiated from the light source (11) in a predetermined pattern according to an electrical signal. The modulated light passes through the color filter and the polarization filter disposed on the front surface of the liquid crystal panel (20) to configure the screen.

The configuration of the liquid crystal display device (1) according to an embodiment of the present invention has been described above. Here, various embodiments of the present application will assume a case of using a mini LED or a micro LED as the light source (11) of the backlight unit, but as to the backlight unit including a light source (11) in which LEDs of uniform or various sizes are directly disposed, various embodiments of the present disclosure may be applied without limitation to the backlight unit.

Here, an optical film according to various embodiments of the present invention will be described in detail.

Figure 2:
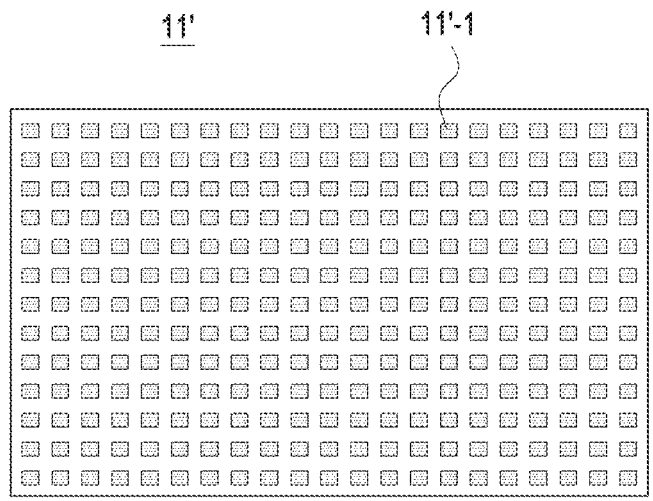
FIG. 2 shows a direct-type LED light source according to an embodiment of the present invention.

Here, the optical film is defined as the diffusion lens sheets (14-1, 14-2) of FIG. 1, or defined as a combination of at least one of the diffusion lens sheets (14-1, 14-2), the reflection sheet (12), the color conversion sheet (13), the diffusion lens sheets (14-1, 14-2), the diffusion sheets (15, 18), the prism sheets (16, 17), and the reflective polarizing sheet (19) of FIG. 2.

Figure 3:
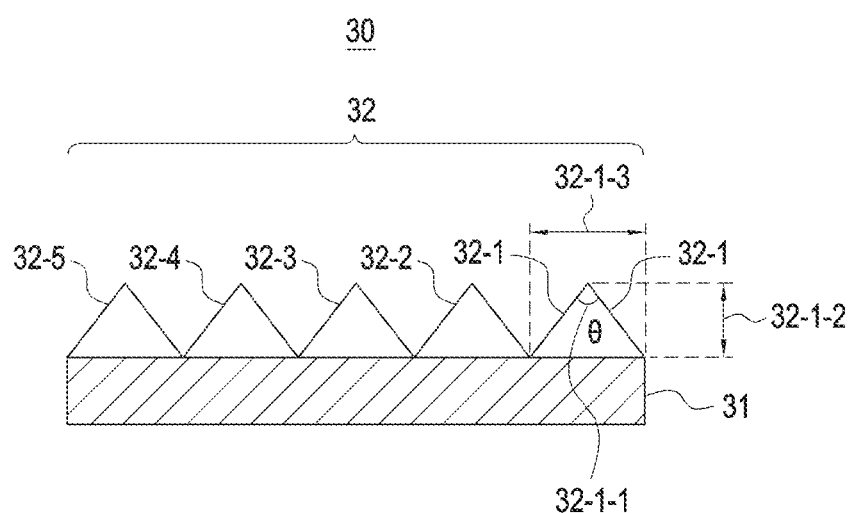
FIG. 3 is a cross-sectional view of a diffusion lens sheet according to an embodiment of the present invention

FIG. 3 is a cross-sectional view of a diffusion lens sheet according to an embodiment of the present invention.

Referring to FIG. 3, the diffusion lens sheet (30) may include a first base film (31) and a diffusion lens layer (32). The diffusion lens sheet (30) may transmit light emitted from a mini LED (Light Emitting Diode) or a micro LED.

The first base film (31) may support the diffusion lens layer (32). The first base film (31) may be made of, for example, PET, PC, PP, etc.

The diffusion lens layer (32) may be disposed on one side of the first base film (31). In addition, the diffusion lens layer (32) may include a plurality of triangular pyramid-shaped lenses (32-1 to 32-5).

In this case, the triangular pyramid-shaped lenses (32-1 to 32-5) may be regularly arranged. Here, the plurality of triangular pyramid-shaped lenses (32-1 to 32-5) may have the same size and shape, or different sizes, but may be similar. Here, it is defined that the diffusion lens sheet (30) includes the first base film (31), but the diffusion lens layer (32) may also be defined to include the first base film (31).

As an example, the apex angle (θ) (32-1-1) may be defined as an angle between two opposing surfaces among four surfaces disposed on the triangular pyramid-shaped lens (32-1). For example, the apex angle may be defined within 40° to 150°, the height (32-1-2) may be defined as about 10 μm, and the width (32-1-3) may be defined as about 20 μm. In this case, the apex angle (32-1-1) may be set based on a separation angle formed by refracting light passing through the triangular pyramid-shaped lens (32-1).

Figure 4:
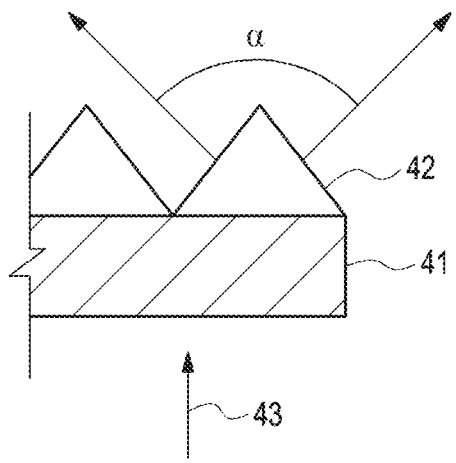
FIG. 4 shows optical separation according to an embodiment of the present invention.

Referring to the embodiment (40) of FIG. 4, the separation angle (α) of the light can be formed when light emitted from the mini LED or the micro LED is incident to one direction (43) of the first base film (41) and then it is penetrating the triangular pyramid-shaped lens (42). Here, the incident angle of the light passing through the triangular pyramid-shaped lens (42) may form a right angle with one surface of the first base film (41).

Figure 5:
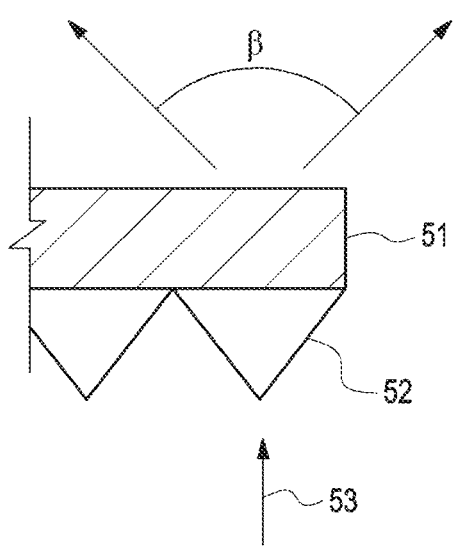
FIG. 5 shows optical separation according to another embodiment of the present invention.

Referring to the embodiment (50) of FIG. 5, the reverse-separation angle (β) of the light is can be formed when the light emitted from the mini LED or the micro LED is incident to the other side direction (53) of the first base film (51) and then it passes through a triangular pyramid shape lens (52). Here, the incident angle of the light passing through the triangular pyramid-shaped lens (52) may form a right angle with one surface of the first base film (51).

On the other hand, the height (32-1-3) of the bottom of the triangular pyramid shape lens (32-1) and the height (32-1-2) of the triangular pyramid shape lens (32-1) can be defined in accordance with the ratio based on the apex angle θ. For example, when the apex angle θ is 90, ratio between the height (32-1-3) of the bottom of the triangular pyramid shape lens (32-1) and the height (32-1-2) of the triangular pyramid shape lens 32-1 can be defined as 2:1.

According to various embodiments of the present invention described above, the diffusion lens sheet (30) separates and diffuses most of the light incident through the pyramid-shaped light diffusion lens, and the amount of reflection in the light incident direction (33, 33') and the opposite direction can be minimized due to the characteristics of the optical lens. Accordingly, visibility of the light source (11) can be minimized while minimizing or improving the luminance loss.

Figure 6:
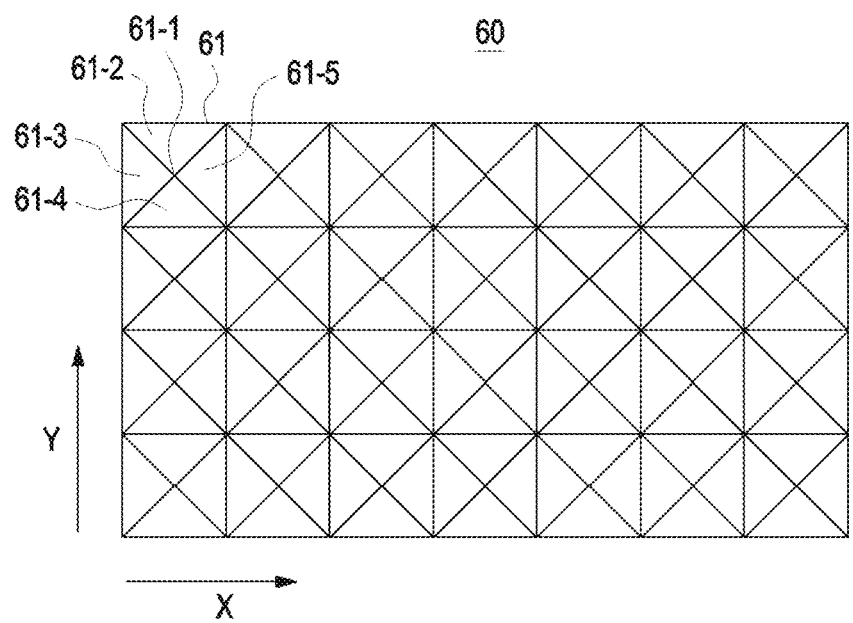
FIG. 6. shows one side of the diffusion lens sheet according to another embodiment of the present invention.

FIG. 6 shows one side of the diffusion lens sheet according to another embodiment of the present invention.

FIG. 6 shows a state in which the diffusion lens sheet (60) is viewed vertically from one side of the diffusion lens sheet (60.) Referring to FIG. 6, one (61) of a plurality of triangular pyramid-shaped lenses disposed on one side of the diffusion lens sheet (60) includes an apex (61-1) and four surfaces (61-2 to 61-5).

Figure 7:
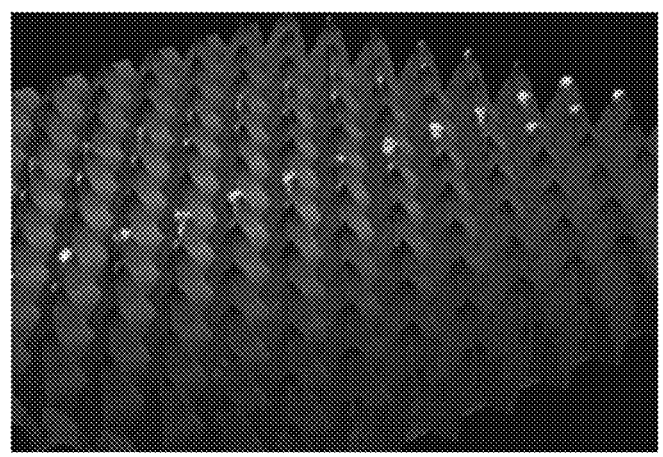
FIG. 7 is a perspective view of a diffusion lens sheet according to an embodiment of the present invention.

FIG. 7 is a perspective view of a diffusion lens sheet according to an embodiment of the present invention.

Referring to FIG. 7, a plurality of triangular pyramid-shaped lenses disposed on one side of the diffusion lens sheet (70) are regularly arranged. Here, the triangular pyramid shape may be defined as a pyramid shape.

Figure 8:
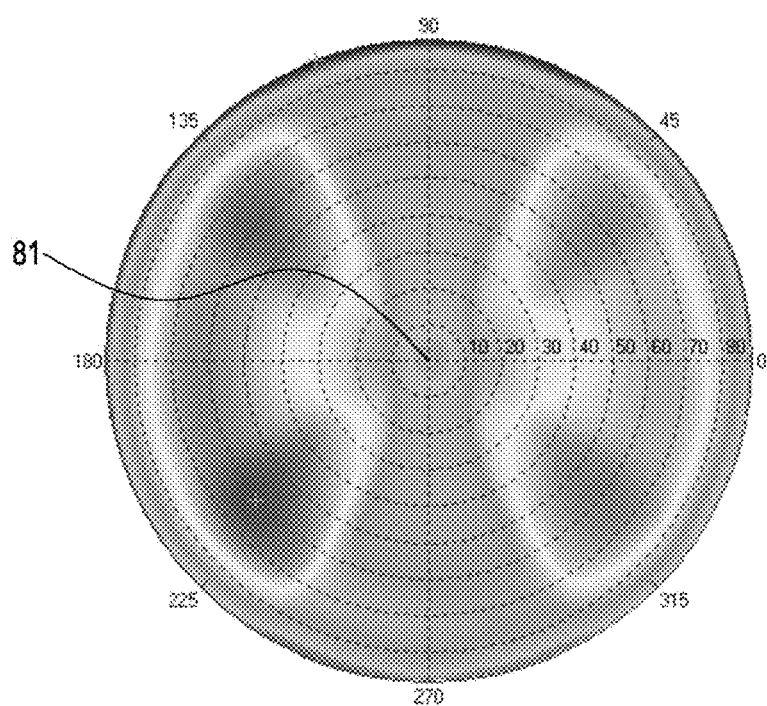
FIG. 8 shows a measurement result of light separation of a diffusion lens sheet according to an embodiment of the present invention.

FIG. 8 shows the measurement result of light separation of the diffusion lens sheet according to an embodiment of the present invention.

For example, FIG. 8 shows the optical separation measurement result for a case where a mini LED light or a micro LED light is incident to the direction of the first base film (31) from the diffusion lens layer (32) of the diffusion lens sheet (30) of FIG. 3. Referring to FIG. 8, the mini LED light or the micro LED light may be symmetrically dispersed with respect to the center of the diffusion lens sheet (30). For example, the mini LED light or the micro LED light may be dispersed in four directions with respect to the center of the diffusion lens sheet (30).

Figure 9:
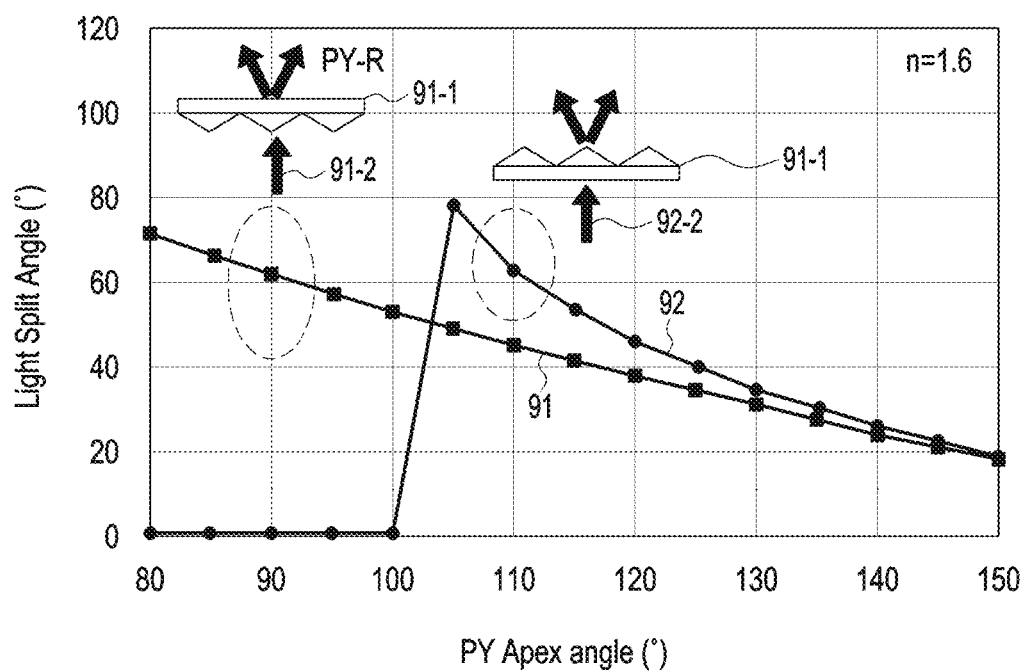
FIG. 9 shows a change in the light separation angle of the diffusion lens layer according to an embodiment of the present invention.

FIG. 9 shows a change in the light separation angle of the diffusion lens layer according to an embodiment of the present invention.

The first graph (91) shows the change in the light separation angle in accordance with the change of the apex angle (PY) when light is incident to the outer direction (91-2) of the triangular pyramid of the diffusion lens layer (91-1). Referring to the first graph (91), it can be seen that the light separation angle decreases as the apex angle increases.

The second graph (92) shows the change in the light separation angle in accordance with the change of the apex angle when light is incident to the inner direction (92-2) of the triangular pyramid of the diffusion lens layer (92-1). Referring to the second graph (92), the light separation is not performed until the apex angle increases to 100°, but, the maximum light separation occurs at the apex angle of 105°, and as the apex angle increases from 105°, it can be seen that the light separation angle decreases.

Referring to the first graph (91) and the second graph (92), it can be seen that target light separation can be induced by adjusting the apex angle in a predetermined angular region.

In the above-described example, since incident light is separated (or diffused) by the action of the diffusion lens layer (32), a hot spot caused by the incident light can be reduced.

Here, various embodiments of a backlight unit using a mini LED or a micro LED as a light source and including a diffusion lens sheet will be described in detail. Below, descriptions of components overlapping with the above-described components will be omitted for convenience of description.

Figure 10:
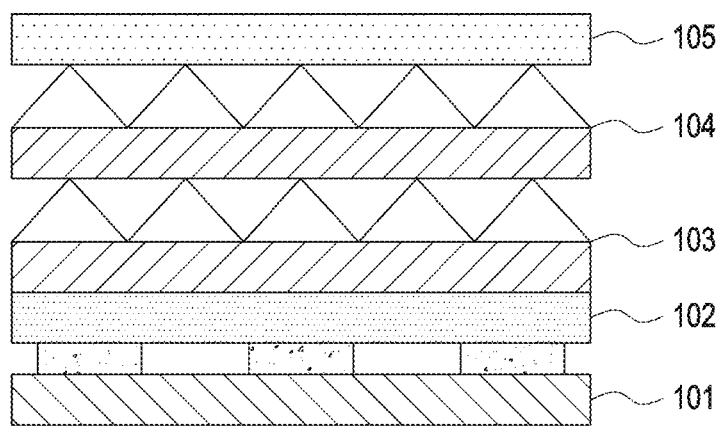
FIG. 10 is a cross-sectional view of a backlight unit according to an embodiment of the present invention.

FIG. 10 is a cross-sectional view of a backlight unit according to an embodiment of the present invention.

The backlight unit (100) may include a light source (101), a color conversion sheet (102), a first diffusion lens sheet (103), a second diffusion lens sheet (104), and an optical sheet (105).

The light source (101) may include or arrange a mini LED or a micro LED, for example.

The color conversion sheet (102) can convert the color of the light emitted from the light source (101). The color conversion sheet (102) will be described in detail with reference to FIG. 11 below.

Figure 11:
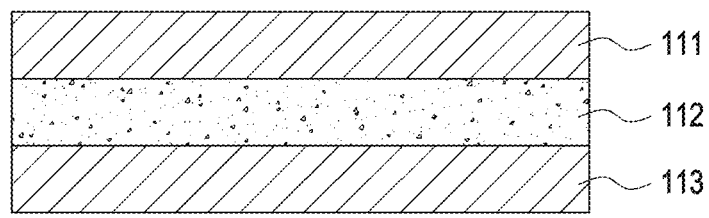
FIG. 11 is a cross-sectional view of a color conversion sheet according to another embodiment of the present invention.

FIG. 11 is a cross-sectional view of a color conversion sheet according to another embodiment of the present invention.

Referring to FIG. 11, the optical film (110) may include a first base film (111), a second base film (112), and a color conversion layer (113).

The first base film (111) and the second base film (112) are disposed in parallel to protect the color conversion layer (113).

The color conversion layer (113) converts colors. The color conversion layer (113) may convert blue light emitted from the mini LED or micro LED into white light.

The color conversion layer (113) may be disposed between the first base film (111) and the second base film (112).

The color conversion layer (113) may include a red phosphor, a green phosphor, and inorganic particles. Here, the red phosphor or green phosphor is a material that absorbs light emitted from the mini LED or the micro LED to form red light or green light. For example, the red phosphor is a KSF ($K_2SiF_6:Mn4+$) phosphor, and the green phosphor is a β-sialon phosphor. In addition, the inorganic particles are for inducing uniform scattering of light. Examples of inorganic particles include $TiO_2$ and $SiO_2$ having a diameter of several hundred nanometers.

For example, the color conversion layer (113) may be formed by stirring red phosphor, green phosphor, and inorganic particles in a resin (silicone, acrylic, etc.). In this case, the color conversion layer (113) may be attached between the first base film (111) and the second base film (112).

For example, the color conversion layer (113) may include a red phosphor, a green phosphor, and inorganic particles according to a predetermined weight ratio. Here, the predefined weight ratio is a weight ratio between the weight of the red phosphor, the weight of the green phosphor, and the inorganic particles, which are determined based on the color coordinate value for white light.

Figure 12:
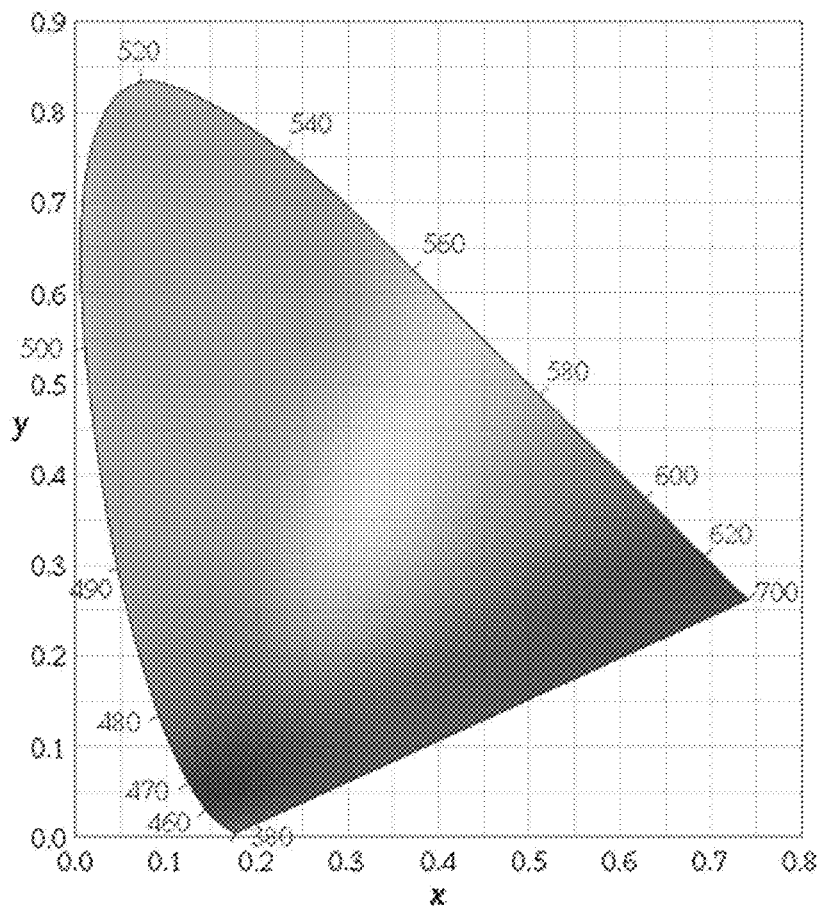
FIG. 12 shows the International Lighting Commission color space according to an embodiment of the present invention.

Referring to FIG. 12, the color coordinate values for the above-described white light may be defined based on the Commission Internationale de l'Eclairage (CIE) color space (120). In this case, color coordinate values for white light may be defined as X coordinate values, Y coordinate values, and Z coordinate values defined in the color space (120).

As an example, the X coordinate value and the Y coordinate value may be defined in 0.27 to 0.33, and the Z coordinate value may be defined as a dependent variable based on the defined X coordinate and Y coordinate.

For example, the weight ratio of the red phosphor is defined within 10% to 80%, the weight ratio of the green phosphor is defined within 10% to 80%, and the weight ratio of the inorganic particles can be defined within 1% to 10%.

In this case, the sum of the weight ratio of the red phosphor, the weight ratio of the green phosphor, and the weight ratio of the inorganic particles may be defined as 100% or less. Further, if the weight ratio is not defined in %, the sum of the weight ratios may be defined as 100 or less as well as greater than 100.

Here, referring to FIG. 12, an example where the weight ratio of the red phosphor is set to be greater than the weight ratio of the green phosphor and the weight ratio of the green phosphor is set to be greater than the weight ratio of the inorganic particles will be described below.

Figure 13:
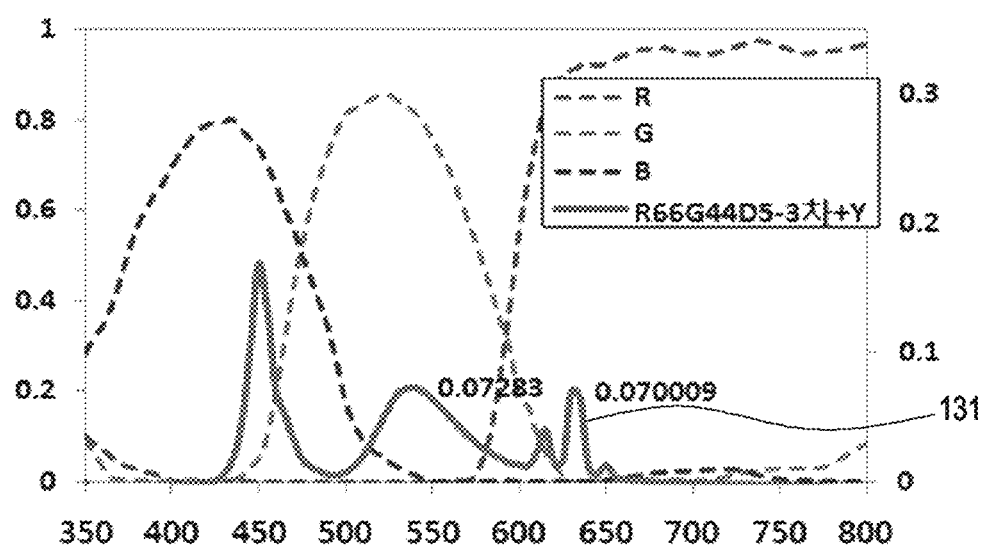
FIG. 13 shows a spectral spectrum measurement result according to an embodiment of the present invention.

FIG. 13 shows a spectral spectrum measurement result according to an embodiment of the present invention.

In the embodiment of FIG. 13, it is a case where the ratio of the weight of the red phosphor, the weight of the green phosphor, and the weight of the inorganic particles included in the color conversion layer is set to 66:44:5. Here, the blue light emitted from the mini LED or the micro LED is converted into the white light while passing through the color conversion layer (or optical film). At the same time, light may be uniformly scattered to provide an appearance characteristic without Mura spots (131).

On the other hand, the first diffusion lens sheet (103) of the backlight unit (100) is disposed on one side of the color conversion sheet (102), a plurality of first lenses in the shape of a triangular pyramid can be formed on one surface while they are aligned in the first direction. For example, the first direction where the plurality of first lenses are aligned may be the X direction or the Y direction in FIG. 6.

The second diffusion lens sheet (104) may be disposed on one side of the first diffusion lens sheet (103), and a plurality of second lenses having a triangular pyramid shape may be formed on one surface while they are aligned in the second direction. For example, the second direction where the plurality of second lenses are aligned may be the X direction or the Y direction in FIG. 6.

According to various embodiments of the present invention, a first direction where the plurality of first lenses are aligned and a second direction where the plurality of the second lenses are aligned may form a predetermined angle.

Figure 14:
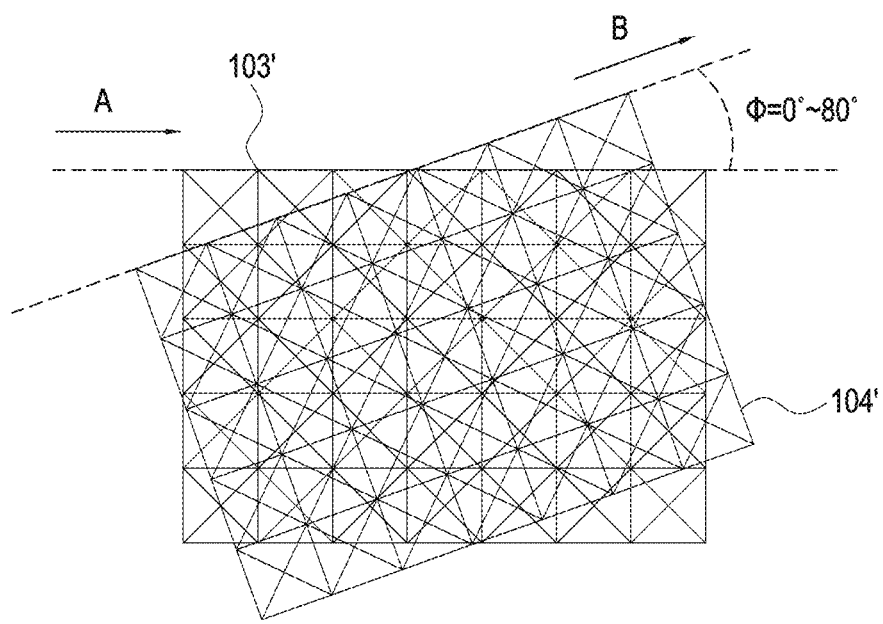
FIG. 14 is a layout view of a diffusion lens sheet according to an embodiment of the present invention.

Referring to FIG. 14, a first direction (axis A direction) where a plurality of first lenses of a first diffusion lens sheet (103') are arranged (or formed) and a second direction (axis B direction) where the plurality of second lenses of a second diffusion lens sheet (104') are disposed may form a predetermined angle. In this case, the first diffusion lens sheet (103') and the second diffusion lens sheet (104') may be formed so that the first direction and the second direction may form a predetermined angle, and at the same time, they may be formed to coincide the size and the shape with each other. For example, the predetermined angle may be formed within 0° to 80°.

As in the above-described embodiment, when the first diffusion lens sheet (103, 103') and the second diffusion lens sheet (104, 104') are disposed by adjusting a predetermined angle formed by the first direction where the plurality of first lenses are aligned and the second direction where the plurality of second lenses are aligned, luminance and hot spot visibility (HSV) may be set. Accordingly, by adjusting the angles between the plurality of lens arrays disposed on the plurality of diffusion sheets (103, 104) included in the backlight unit (100), it is possible to maximize the performance of the unit (100) where the luminance deterioration is minimized and the hot spot visibility is minimized while the light is separated and diffused.

In the above-described embodiment of the present invention, hotspot visibility may be defined by Equation 1 below.

$$HSV(\%) = \frac{(I_{max} - I_{min})}{(I_{max} + I_{min})} \times 100 \quad [\text{Equation 1}]$$

Here, HSV may be defined as a hotspot visibility, $I_{max}$ is a maximum value of luminance, and Imin is a minimum value of luminance.

Figure 15:
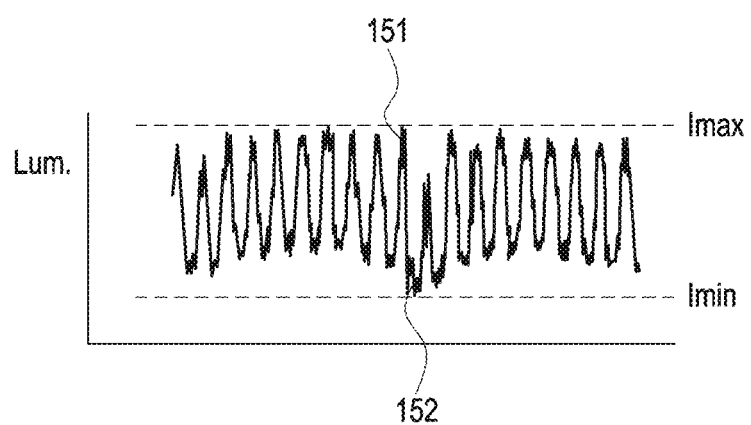
FIG. 15 shows a luminance measurement value according to an embodiment of the present invention.

Here, referring to FIG. 15, Imax (151) is defined as the maximum value in the luminance measurement for the row or column of the randomly selected mini LED or micro LED as a light source (101) and Imin (152) is defined as the minimum value in the luminance measurement for a row or column of the randomly selected mini LED or micro LED.

On the other hand, the optical sheet (105) of the backlight unit (100) may be a laminated form of a plurality of optical films. In a first form of lamination, the optical sheet (105) may be formed by laminating the prism sheets (16, 17) of FIG. 1. In a second form of lamination, the optical sheet (105) may be formed by laminating the prism sheets (16, 17) of FIG. 1 and one diffusion sheet (reference number 15 or reference number 18 in FIG. 1).

Figure 16:
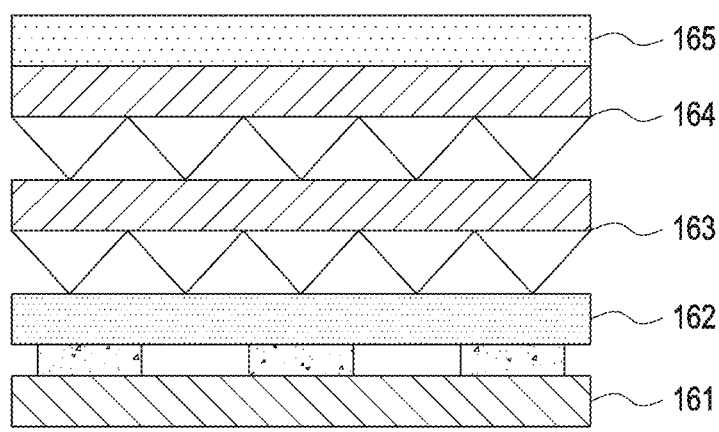
FIG. 16 is a cross-sectional view of a backlight unit according to another embodiment of the present invention.

FIG. 16 is a cross-sectional view of a backlight unit according to another embodiment of the present invention.

The backlight unit (160) may include a light source (161), a color conversion sheet (162), a first diffusion lens sheet (163), a second diffusion lens sheet (164), and an optical sheet (165). Here, content overlapping with the configuration of the backlight unit (100) in FIG. 10 will be omitted for convenience of description.

Below, the first diffusion lens sheet (103) and the second diffusion lens sheet (104) of the backlight unit (100) in FIG. 10 are arranged in a forward direction with respect to the light source (101), and the first diffusion lens sheet (163) and the second diffusion lens sheet (164) of the backlight unit (160) in FIG. 16 are defined as being arranged in a reverse direction with respect to the light source (161).

Below, the experimental results of the performance change of the backlight unit according to a predetermined angle adjustment between the first direction of the first diffusion lens sheet and the second direction of the second diffusion lens sheet will be described in detail.

Below, the optical sheet (105) included in the backlight unit may be in the first form or the second form of the above-describe lamination. In addition, a predetermined angle between the first direction of the first diffusion lens sheet and the second direction of the second diffusion lens sheet is set to 0°, 20°, 30°, 40°, 50°, 60°, 70°, and 80°, etc. In addition, the first diffusion lens sheet and the second diffusion lens sheet may be arranged in a forward direction or in a reverse direction. The backlight unit may be formed in various combinations of these.

Figure 17:
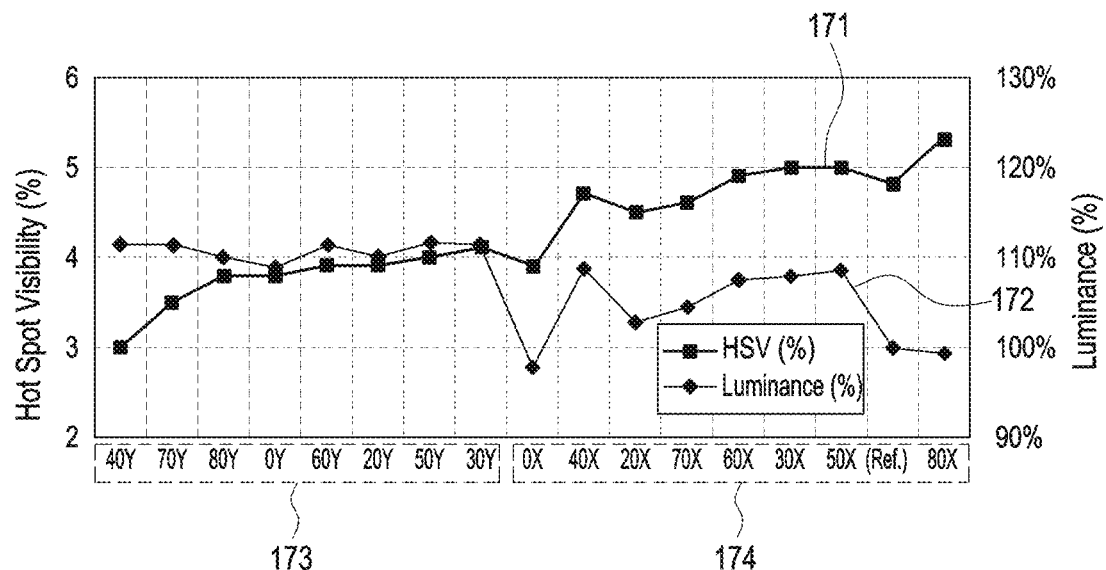
FIG. 17 is a view showing an optical experiment result of a backlight unit according to various embodiments of the present disclosure.

FIG. 17 shows an optical test result of a backlight unit according to various embodiments of the present invention.

Below, it is defined that the first diffusion sheet and the second diffusion sheet are arranged in a forward direction. In addition, hotspot visibility (%) (171) and luminance (172) are measurement results for each of the first form (173) and the second form (174) of the above-described lamination. For example, in 40Y of FIG. 17, 40 may be defined as a predetermined angle, Y may be defined as a first type, and X may be defined as a second type. In addition, the reference experimental example relates to a backlight unit including three diffusion sheets, two prism sheets, and a color conversion sheet including quantum dots.

Referring to FIG. 17, in the case of the reference experimental example, hotspot visibility is measured to be 4.8%, and luminance is measured to be 100%. Here, the higher performance may be defined when the smaller the hot spot visibility and the larger the luminance. As an example, a case where the hotspot visibility (%) (171) is 4% or less may be defined as an optimal result.

Referring to FIG. 17, comparing to the reference experiment example, for a case of the experimental example (40Y) where the optical sheet is the first form (173) of the above-described lamination, and the angle of the first diffusion lens sheet and the second diffusion lens sheet is set to 40°, hotspot visibility is measured to be 3% and luminance is 111%. As a result, it may be evaluated as exhibiting the best performance among the plurality of experimental examples in FIG. 17.

Figure 18:
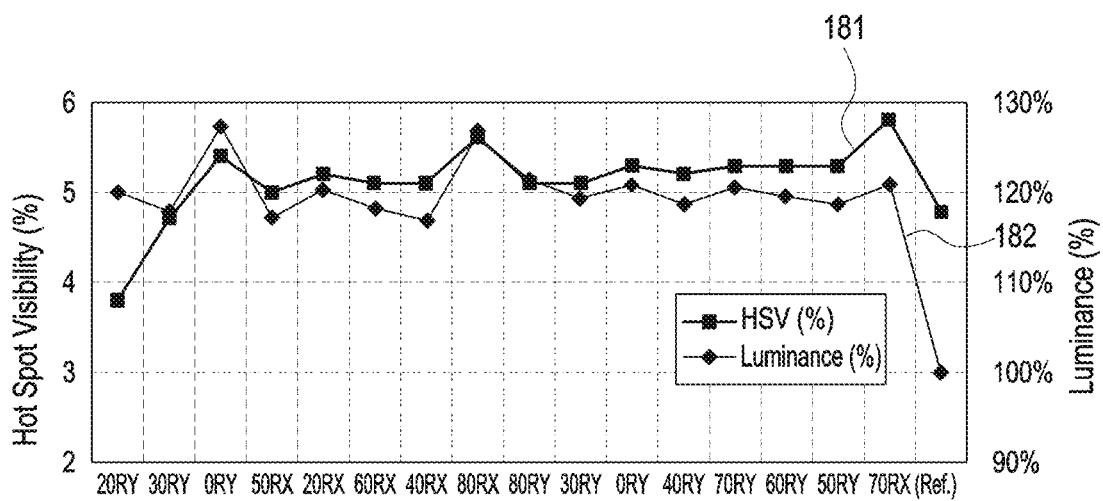
FIG. 18 shows an optical test result of a backlight unit according to another embodiment of the present invention.

FIG. 18 shows an optical test result of a backlight unit according to another embodiment of the present invention.

Below, it is defined that the first diffusion sheet and the second diffusion sheet are arranged in a reverse direction. In addition, hotspot visibility (%) and luminance are measurement results for each of the first and second forms of the above-described lamination. For example, in 20RY of FIG. 18, 20 may be defined as a predetermined angle, R may be reverse, Y may be defined as a first type, and X may be defined as a second type. In addition, the reference experimental example relates to a backlight unit including three diffusion sheets, two prism sheets, and a color conversion sheet including quantum dots.

Referring to FIG. 18, in the case of the reference experimental example, hotspot visibility is measured to be 4.8%, and luminance is measured to be 100%. Here, the higher performance may be defined when the smaller the hot spot visibility and the larger the luminance. As an example, a case where the hotspot visibility (%) (181) is 4% or less may be defined as an optimal result.

Referring to FIG. 18, comparing to the reference experiment example, for a case of the experimental example (20RY) where the optical sheet is the second form of the above-described lamination, and the angle of the first diffusion lens sheet and the second diffusion lens sheet is set to 20°, hotspot visibility is measured to be 3.8% and luminance is 120%. As a result, it may be evaluated as exhibiting the best performance among the plurality of experimental examples in FIG. 18.

Figure 19:
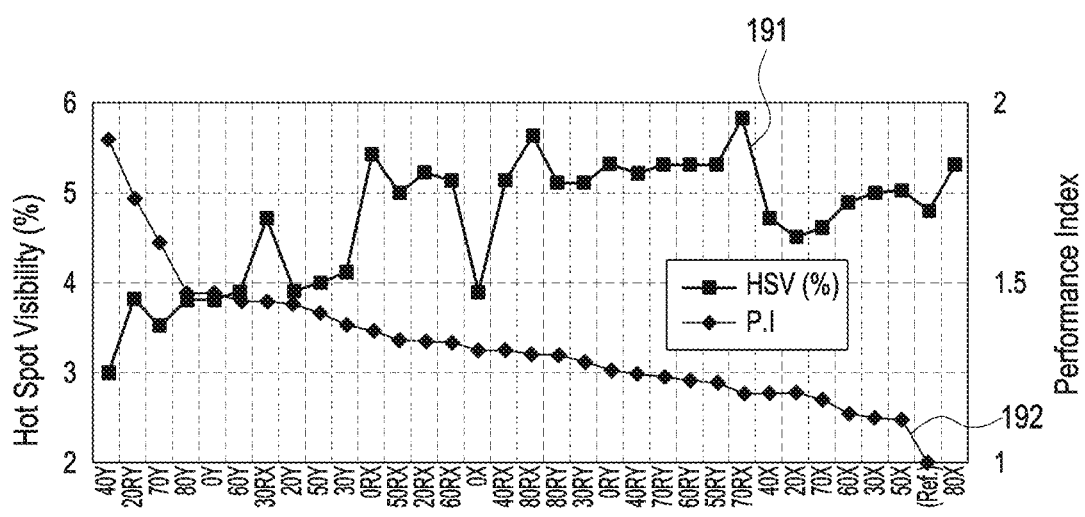
FIG. 19 shows an optical test result of a backlight unit according to an embodiment of the present invention.

FIG. 19 shows an optical test result of a backlight unit according to an embodiment of the present invention.

Below, it is defined that the first diffusion sheet and the second diffusion sheet are arranged in a forward or a reverse direction. In addition, hotspot visibility (%) and luminance are measurement results for each of the first and second forms of the above-described lamination. For example, in 20RY of FIG. 19, 20 may be defined as a predetermined angle, R may be reverse, Y may be defined as a first type, and X may be defined as a second type. In addition, the reference experimental example relates to a backlight unit including three diffusion sheets, two prism sheets, and a color conversion sheet including quantum dots.

In the experimental result of FIG. 19, PI (Performance Index) is defined. PI is defined based on Equation 2 below.

$$PI = \frac{\left(\frac{Lum}{Lum_{ref}} - 10 \cdot \Delta_y\right)}{\left(\frac{HSV}{HSV_{ref}}\right)} \quad [\text{Equation 2}]$$

Here, Lum is the luminance, Lumref is the luminance reference, HSV is the hotspot visibility, HSVref is the reference of the hotspot visibility, and $\Delta_y$ may be defined as the Y color coordinate deviation ($y_{white}-y_{ref}$) of the CIE.

Here, PI is an index capable of simultaneously evaluating hot spot visibility performance and luminance performance.

Referring to FIG. 19, in the case of the reference experimental example, hotspot visibility is measured to be 4.8%, and luminance is measured to be PI=1. Here, the higher performance may be defined when the smaller the hot spot visibility and the larger the PI.

Referring to FIG. 19, comparing to the reference experiment example, for a case of the experimental example (40Y) where the optical sheet is the second form of the above-described lamination, and the angle of the first diffusion lens sheet and the second diffusion lens sheet is set to 40°, hotspot visibility is measured to be 3% and PI is 1.875. As a result, it may be evaluated as exhibiting the best performance among the plurality of experimental examples in FIG. 19.

Figure 20:
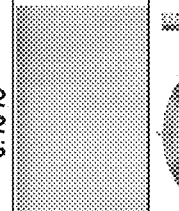
FIG. 20 shows an optical test result of a backlight unit according to an embodiment of the present invention.
Figure 20:
Figure 20:
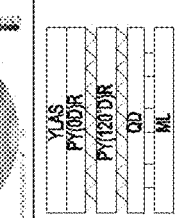
Figure 20:
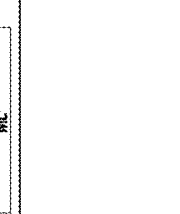
Figure 20:
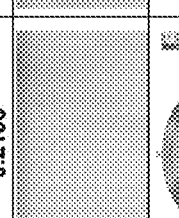
Figure 20:
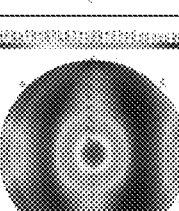
Figure 20:
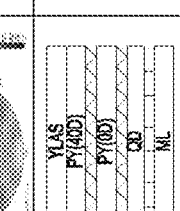
Figure 20:
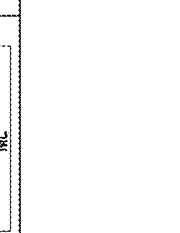
Figure 20:
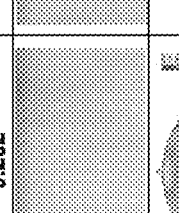
Figure 20:
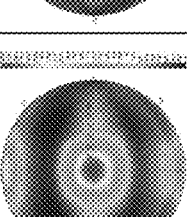
Figure 20:
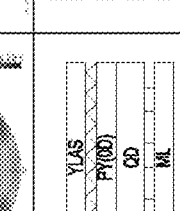
Figure 20:
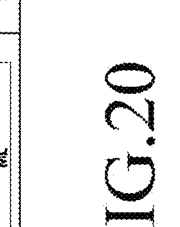

FIG. 20 shows an optical test result of a backlight unit according to an embodiment of the present invention.

Referring to FIG. 20, Experiment 1 (201) relates to a backlight unit comprising a mini LED or a micro LED, a color conversion sheet including a quantum dot, a diffusion sheet, and an optical film of the second type; Experiment 2 (202) relates to a backlight unit comprising a mini LED or a micro LED, a color conversion sheet including a quantum dot, a diffusion lens sheet, and an optical film of the second type; Experiment 3 (203) relates to a backlight unit comprising a mini LED or a micro LED, a color conversion sheet including quantum dots, a forward direction type first diffusion lens sheet and a forward direction type second diffusion lens sheet having a predetermined angle of 40°, and an optical film of the second type; and Experiment 4 (204) relates to a backlight unit comprising a mini-LED or micro-LED, a color conversion sheet including quantum dots, a reverse type first and second diffusion lens sheet having a predetermined angle of 120°, and an optical film of a second type.

Referring to FIG. 20, in the case of Experiment 3 (203), the hot spot visibility (HSV) is 3.6%, and it can be determined that the hot spot visibility performance is better than that of other experiments. Specifically, it may be determined that the hotspot visibility performance is the best when a predetermined angle between the first diffusing lens sheet and the second diffusing lens sheet is set to 40°, the optical film of the second type is disposed, and the first diffusing lens sheet and the second diffusing lens sheet are disposed in the reverse direction.

FIG. 21 shows an optical test result of a backlight unit according to another embodiment of the present invention.

Referring to FIG. 21, Experiment 1 (211) relates to a backlight unit comprising a mini LED or a micro LED, a color conversion sheet including a quantum dot, three diffusion sheets, and an optical film of the first type; Experiment 2 (212) relates to a backlight unit comprising a mini LED or a micro LED, a color conversion sheet including quantum dots, a forward direction type first diffusion lens sheet and a forward direction type second diffusion lens sheet having a predetermined angle of 0°, and an optical film of the second type; Experiment 3 (213) relates to a backlight unit comprising a mini-LED or micro-LED, a color conversion sheet including quantum dots, a reverse type first and second diffusion lens sheet having a predetermined angle of 30°, and an optical film of the first type; Experiment 4 (214) relates to a backlight unit comprising a mini-LED or micro-LED, a color conversion sheet including quantum dots, a reverse type first and second diffusion lens sheet having a predetermined angle of 120°, and an optical film of the first type; and Experiment 5 (215) relates to a backlight unit comprising a mini-LED or micro-LED, a color conversion sheet including quantum dots, a reverse type first and second diffusion lens sheet having a predetermined angle of 0°, and an optical film of the first type.

Referring to FIG. 21, in the case of Experiment 2 (212), the hotspot visibility (HSV) is 4.1%, and it can be determined that the hotspot visibility performance is better than that of other experiments. Specifically, it may be determined that the hotspot visibility performance is the best when a predetermined angle between the first diffusing lens sheet and the second diffusing lens sheet is set to 0°, the optical film of the second type is disposed, and the first diffusing lens sheet and the second diffusing lens sheet are disposed in the forward direction. For example, when luminance performance is considered to be more important than hot spot visibility performance for the backlight unit, the backlight unit configurations of Experiments 3 to 5 may be considered.

In the foregoing, although embodiments of the present invention have been shown and described, those skilled in the art will be aware of the details in form and detail without departing from the spirit and scope of the present embodiment as defined by the attached claims and their equivalents. It will be understood that various changes may be made.

What is claimed is:

1. A backlight unit comprising:
a mini LED (Light Emitting Diode) or a micro LED as a light source;
a color conversion sheet for converting a color of light emitted from the mini LED or the micro LED;
a first diffusion lens sheet disposed on one side of the color conversion sheet wherein a plurality of first lenses having a quadrangular pyramid shape are aligned in a first direction and formed on one surface;
a second diffusion lens sheet disposed on one side of the first diffusion lens sheet wherein a plurality of second lenses having a quadrangular pyramid shape are aligned in a second direction and formed on one surface,
a first prism sheet having a plurality of prisms disposed on one surface to condense light; and
a second prism sheet formed by bonding to one surface of the first prism sheet wherein a plurality of prisms disposed on one surface to condense light.

2. The backlight unit of claim 1, further comprising:
a diffusion sheet including a diffusion pattern for light diffusion.

3. A backlight unit of claim 2, further comprising
a bead included in the diffusion sheet.

4. The backlight unit of claim 1, further comprising:
an apex angle which is an angle between two opposing surfaces among four surfaces disposed on the plurality of first lenses or the plurality of second lenses is set based on a separation angle formed by refracting light passing through the plurality of first lenses or the plurality of second lenses.

5. The backlight unit of claim 4, wherein a size and an angle of facing surfaces of the four surfaces disposed on the plurality of first lenses or the plurality of second lenses are the same as each other; and
a size and an angle of adjacent surfaces of the four surfaces disposed on the plurality of first lenses or the plurality of second lenses are different from each other.

6. The backlight unit of claim 4, wherein a height of bottom surfaces of the plurality of first lenses and a height of the plurality of first lenses are defined according to a ratio based on a first apex angle with respect to the plurality of first lenses; and a height of bottom surfaces of the plurality of second lenses and a height of the plurality of second lenses are defined according to a ratio based on a second apex angle with respect to the plurality of second lenses.

7. The backlight unit of claim 1, wherein the first direction and the second direction form a predetermined angle.

8. The backlight unit of claim 7, wherein the predetermined angle is 0° to 80°.

9. The backlight unit of claim 1, further comprising:

at least one of a red phosphor, a green phosphor, a quantum dot, and an inorganic particle included in the color conversion sheet in accordance with a predefined weight ratio.

\* \* \* \* \*